United States Patent [19]

Bluzer

[11] Patent Number: 5,021,658
[45] Date of Patent: Jun. 4, 1991

[54] SUPERCONDUCTING INFRARED DETECTOR

[75] Inventor: Nathan Bluzer, Rockville, Md.

[73] Assignee: Westinghouse Electric Corp., Pittsburgh, Pa.

[21] Appl. No.: 373,075

[22] Filed: Jun. 29, 1989

[51] Int. Cl.$^5$ .................... H01L 27/14; H01L 27/18
[52] U.S. Cl. .............................. 250/336.2; 250/338.1; 505/849
[58] Field of Search ............... 250/336.2, 336.1, 338.1; 505/848, 849

[56] References Cited

U.S. PATENT DOCUMENTS

| | | |
|---|---|---|
| 3,816,845 | 6/1974 | Cuomo et al. . |
| 4,202,959 | 9/1980 | Kroger . |
| 4,242,419 | 12/1980 | Dayem et al. . |
| 4,315,255 | 2/1982 | Harris and Hamilton . |
| 4,432,134 | 2/1984 | Jones et al. . |
| 4,496,854 | 1/1985 | Chi . |
| 4,646,060 | 2/1987 | Phillips et al. . |
| 4,672,359 | 6/1987 | Silver . |
| 4,804,649 | 2/1989 | Sherif . |
| 4,853,538 | 8/1989 | Jackson ........................... 250/336.2 |

FOREIGN PATENT DOCUMENTS 2202528A 9/1988 United Kingdom .

OTHER PUBLICATIONS

Hamilton et al., "100 GHz Binary Counter Based on DC SQUID", IEEE Electron Device Letters, vol. EDL-3, No. 11, pp. 335-338, Nov. 1982.
Willis et al., "Superconductivity above 90° K. in Magnetic Rare Earth Barium-Copper Oxides", Jo. of Magnetism & Magnetic Materials, 67, 1987, No. Holland, Amsterdam.
Leung et al., "Optical Detection in Thin Granular Film of Y-Ba-Cu-O at Temperatures, Between 4.2 and 100° K", pp. 2046-2047, Applied Physics Letters, vol. 50 (1987).

Primary Examiner—Janice A. Howell
Assistant Examiner—Richard Hanig

[57] ABSTRACT

This is superconducting infrared sensor for producing output through a superconducting transformer. An increase in infrared light level causes a drop in current through a high temperature oxide superconductor film and its series primary winding and thereby causing an increase in current through a reference resistor and its series primary winding, and as the two primary windings are in bucking relationship, the change in current in the secondary is the sum of the absolute values of the changes in current through the high temperature oxide superconductor film and the reference resistor, and thus the current in the secondary of the transformer is a function of the infrared light level on the granular high temperature oxide superconductor film. A constant bias current source is connected in a manner so that the first series combination and the second series combination are in parallel with respect to the current source. The current source provides a bias current through the high temperature oxide superconductor film which is at least equal to the critical current of the high temperature oxide superconductor film when the infrared light level on the high temperature oxide superconductor film is essentially zero. Preferably, the reference resistor and the high temperature oxide superconductor film have resistances which are essentially equal when the infrared light level on the high temperature oxide superconductor film is essentially zero. The sensor is very sensitive to infrared, but relatively insensitive to noise in the bias current.

3 Claims, 3 Drawing Sheets

SUPERCONDUCTING INFRARED DETECTOR

CROSS-REFERENCE TO RELATED APPLICATION

A superconducting Josephson junction and a method for making such a Josephson junction is described in related application Ser. No. 030,003, filed Mar. 23, 1987, now U.S. Pat. No. 4,768,069 and assigned to the assignee herein. That related application utilizes a layer of niobium nitride on a substrate, an epitaxial layer of a pseudo-binary compound on the layer of niobium nitride, where the pseudo-binary compound has the composition about 3 atomic percent magnesium oxide—about 97 atomic percent calcium oxide, to about 97 atomic percent magnesium oxide—about 3 atomic percent calcium oxide, and an epitaxial layer of niobium nitride on the layer of pseudo-binary compound.

A superconducting digital logic amplifier for interfacing superconductor circuits with semiconductor circuits is shown in co-pending application Ser. No. 194,688 filed Aug. 10, 1989 now U.S. Pat. No. 4,854,879 and assigned to the assignee herein. That amplifier provides a gigahertz amplifier to convert low voltage superconducting logic signals to higher voltage signals, suitable for semiconductor signal processing circuits (for example, providing a factor of ten voltage gain to raise the 2.5 mV Josephson logic signals of conventional metallic superconductor circuitry to 25 mV signals for input into conventional semiconductor amplifiers which, in turn, can drive semiconductor logic circuitry). Generally, it utilizes a first series string of Josephson junctions in series with an input Josephson junction to provide a series combination which is then connected in parallel with a second string of higher critical current Josephson junctions. Current from Josephson junction logic circuitry is introduced through the input Josephson junction, exceeding its critical current and switching it to the resistive state, the combined input and current from a DC current source, then switches the Josephson junctions in the first and then the second series to the resistive state, giving an output voltage equal to the sum of all of the voltages across the Josephson junctions in the series strings.

A process for use in fabrication of a ceramic superconductor containing barium or strontium or both, is shown in co-pending application Ser. No. 154,39, filed Feb. 10, 1988 and assigned to the assignee herein. That process comprises: vaporizing chelates of metallic constituents of the superconductor at 150°-350° C., thereby producing a chelate composite vapor; mixing the chelate composite vapor with oxygen-containing gas to produce a gaseous chemical vapor deposition mixture; heating a substrate to between 350° and 650° C.; and contacting the gaseous chemical vapor deposition mixture to the substrate to produce a ceramic film.

A process for use in fabrication of a ceramic superconductor containing barium or strontium or both, is shown in co-pending application Ser. No. 286,400 filed Dec. 19, 1988 now U.S. Pat. No. 4,934,569 and assigned to the assignee herein. That process comprises: dissolving nitrates of a plurality of metallic constituents of the superconductor in water or an organic solvent to produce a liquid nitrate solution; producing a dispersed nitrate-containing mixture by nebulizing the nitrate solution with an oxygen-containing gas or by nebulizing with a carrier gas to produce a nebulized dispersion and mixing the nebulized dispersion with oxygen-containing gas; and flash decomposing and oxidizing the nitrates of the nitrate-containing mixture to produce a product ceramic.

A superconducting analog to digital converter for producing a digital output signal which is a function of an analog input signal is described in related application Ser. No. 07/372,990 and assigned to two assignees, one of which is the assignee herein. In that copending application, the analog to digital converter uses a nonhysteresis-shunted Josephson junction, an input superconducting inductor, and an output Josephson junction, which output Josephson junction is not nonhysteresis-shunted, connected in superconducting loop relationship. A flux proportional to an analog input signal is coupled into the input inductor and a constant bias current source is connected such that the current divides between the nonhysteresis-shunted Josephson junction and the output Josephson junction. A Josephson junction integrating counter circuit is connected to sense at least the ac portion of voltage across the output Josephson junction and the Josephson junction integrating counter circuit is gated. The number of oscillations in the voltage across the output Josephson junction in a predetermined period of time is a function of the analog input signal and the count of the Josephson junction integrating counter circuit during the predetermined period provides a digital output which is a function of to the input signal. That copending application is especially adaptable for use with the instant invention, and is hereby incorporated by reference herein.

BACKGROUND OF THE INVENTION

1. Field of the Invention

This invention relates to infrared detection circuitry. In particular, it relates to a superconducting infrared circuitry for extremely low level signals.

2. Description of the Related Art

Superconducting circuitry is, of course, well known in the art. U.S. Pat. Nos. 4,432,134 issued Feb. 21, 1984, to Jones et al.; 4,242,419 issued Dec. 30, 1980, to Dayem et al.; 4,202,959 issued Sept. 2, 1980, to Kroger; and, 3,816,845 issued June 11, 1974, to Cuomo et al., give examples of superconducting Josephson junction configurations and processes for making them. Circuitry using Josephson junctions for analog-to-digital conversion is shown in U.S. Pat. No. 4,646,060 issued 2/24/87 to Phillips et al, U.S. Pat. No. 4,315,255 issued 2/9/82 to Harris and Hamilton, and U.S. Pat. No. 4,672,359 issued 6/9/87 to Silver. The operating parameters of DC SQUID's and a SQUID amplifier are described in U.S. Pat. No. 4,496,854 issued to Chi et al on 1/29/85. A paper entitled "100 GHz Binary Counter Based on DC SQUID", by Hamilton and Lloyd, IEEE Electron Device Letters, Vol. EDL-3, No. 11, pp 335-38, November 1982, describes the Josephson junction integrating counter circuit. The Hamilton et al circuit is the preferred counter for use with the instant invention.

The recent discovery by Muller and Bednorz of ceramic oxide superconductors which are superconductive at relatively high temperatures (e.g. now 90° K. or above) has dramatically increased the interest in superconductivity and resulted in a large number of publications. The ceramic superconductors have generally been oxides of at least one rare earth (hereafter the term "rare earth" will be understood to include yttrium as well as the lanthanide elements, unless otherwise stated), at least one alkaline earth metal, and copper, although recently barium (or thallium), calcium, strontium, copper, oxide superconductors have been developed. For example, Willis et al. in a letter to the editor entitled "Superconductivity Above 90° K. in Magnetic Rare Earth-Barium-Copper Oxides" (Journal of Magnetism and Magnetic Materials 67, 1987, North Holland, Amsterdam) report measurements of superconducting and magnetic behavior on samples which were prepared by sintering the rare earth oxide, copper oxide, and barium carbonate. Ceramic superconductors are very sensitive to oxygen content and the oxygen content is generally adjusted by the high temperature annealing. U.S. Pat. No. 4,804,649 issued to Sherif on 2/14/89 describes an oxalate precipitation process for forming metal oxide ceramic superconductors. British patent 2,202,528 A, published 9/28/88, describes superconducting oxide-metal composites (which also contain a noble metal) in a number of forms, including as a thin film. Infrared sensors using high temperature superconducting oxide ceramics is discussed in an article by Leung et al entitled "Optical detection in thin granular film of Y-Ba-Cu-O at temperatures between 4.2° and 100° K.", pages 2046–47, Applied Physics Letters, Vol. 50 (1987).

SUMMARY OF THE INVENTION

This is superconducting infrared sensor for producing an output through a superconducting transformer, which output is a function of an infrared light level. An increase in infrared light level causes a drop in current through the high temperature oxide superconductor film and its series primary winding and thereby an increase in current through the reference resistor and its series primary winding, and as the primary windings are in bucking relationship, the change in current in the secondary is the sum of the absolute values of the changes in current through the high temperature oxide superconductor film and the reference resistor, and thus the current in the secondary of the transformer is a function of the infrared light level on the granular high temperature oxide superconductor film. The sensor is very sensitive, but relatively insensitive to noise in the bias current.

The infrared sensor comprises: a superconducting transformer having a first primary winding, a second primary winding, and a secondary; a granular high temperature oxide superconductor film connected in series with the first primary winding to provide a first series combination; a reference resistor connected in series with the second primary winding to provide a second series combination; and a constant bias current source connected in a manner so that the first series combination and the second series combination are in parallel with respect to the current source and so that currents induced in the secondary from the primary windings as a result of the bias current are in bucking relationship. The current source is controllable to provide a bias current through the high temperature oxide superconductor film which is at least equal to the critical current of the high temperature oxide superconductor film when the infrared light level on the high temperature oxide superconductor film is essentially zero. Preferably, the reference resistor and the high temperature oxide superconductor film have resistances which are essentially equal when the infrared light level on the high temperature oxide superconductor film is essentially zero and the first primary winding and the second primary winding have a common connection.

BRIEF DESCRIPTION OF THE DRAWINGS

This invention can be best understood by reference to the following drawings in which.

DESCRIPTION OF THE PREFERRED EMBODIMENTS

Figure 1:
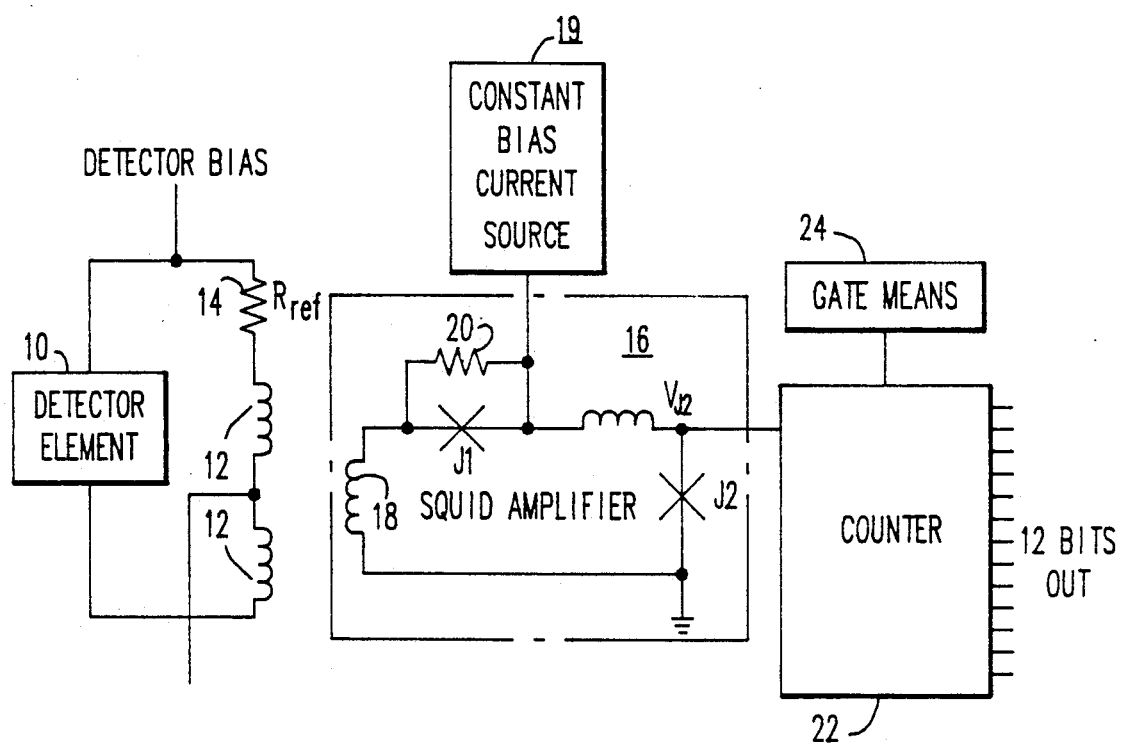
FIG. 1 shows a diagram of an embodiment using the infrared detector with a superconducting analog-to-digital converter.

Recent advances in superconductivity may lead to widespread use of superconductor circuits in high-speed, very low level signal processing. The picosecond switching speed of Josephson junctions can be applied in an analog-to-digital converter capable of operation at X-band frequencies. High-speed shift registers are under development, which could be used to store the output of such an A/D convertor. A 10 GHz shift register can also be used to multiplex or demultiplex a fast data stream. While most development has been in the traditional metallic superconductors which operate at liquid helium temperature (4° Kelvin), this technology will generally be applicable to the new high temperature ceramic superconductors.

This is a superconducting infrared (IR) detector circuit. The photogenerated current is used as the output readout signal instead of using a voltage signal. The ac portion of the photogenerated signal current is sent out through a superconducting transformer, configured to cancel the dc bias current (and associated noise) and to double the photogenerated ac signal current. A flowing bias current, preferably twice the high temperature superconductor critical current, is preferably divided approximately equally between the high temperature superconductor element and the shunting resistor. Both currents flow through different and opposite primary transformer windings to provide flux cancellation in the secondary winding. Correspondingly, the effort of any change in the current partition between the high temperature superconductor and the shunting resistor elements is doubled in the secondary winding. If a 100 to 1 turn ratio is employed, for example the current change provided in the secondary winding will be increased 200 times over the current change in the superconducting detector element.

The invention is a superconductive electronic circuit that can, for example, provide an output to an analog-to-digital converter for digitizing picoamp signals. Because of its low power consumption, the readout circuit can be used on a focal plane of infrared sensors without producing significant cooling load. Increased sensitivity can be obtained through the use of a SQUID input stage of the aforementioned copending application Ser. No. (W.E. Case No. 55201), instead of the usual single Josephson junction input pulser.

This invention can be used, for example, in the fabrication of a very small, extremely sensitive, superconductive infrared sensor element that is suitable for use, for example, in a focal plane array. Granular films of the high $T_c$ superconductor (e.g. YBCO) can be used as the detector elements. The photoresponse signal can then be amplified and digitized in the superconductive electronic circuit that is the subject of the copending invention.

The photoresponse of the high temperature superconductor films apparently derives from the granular nature of the films. Islands of superconductivity in the grains are apparently connected by weak links between the grains. The films are biased near the critical current of the weak links. Incoming photons break Cooper pairs. This diminishes the critical current through the weak links, so that the applied current drives them into the voltage state. This mechanism forms the basis for the design of a sensor with high temperature superconductor detector films.

High temperature superconductor IR detectors need about 1 mA of dc bias current to operate. Typically, the output signal is a small voltage signal on a large (100 mV) dc voltage. This total output voltage level (100 mV dc) is incompatible with conventional JJ circuits. Thus in this invention, the photogenerated current is used as the output signal instead of using a voltage signal. The ac photogenerated signal current is obtained through a transformer, configured to cancel the dc bias current (and associated noise) and to double the photogenerated ac signal current. This concept is implemented by shunting the high temperature superconductor with a resistor and transformer winding. A flowing bias current, preferably twice the high temperature superconductor critical current, is divided approximately equally between the high temperature superconductor element and the shunting resistor. Both currents flow through different and opposite primary transformer windings to provide flux cancellation in the secondary winding. Correspondingly, the effort of any change in the current partition between the high temperature superconductor and the shunting resistor elements will be doubled in the secondary winding. If a 100 to 1 turn ratio is employed, the current change in the detector element will thus be increased a total of 200 times as measured in the secondary winding.

The low light levels envisioned mean that some sort of signal amplification will be required between the detector film and a Josephson A/D. Fortunately, superconductor electronics can make extremely low-noise amplifiers using the dc SQUID. For example, SQUIDs can be made with an input sensitivity of $10^{-6}\phi_o/\sqrt{Hz}$. With a 1 kHz frame rate. about $3\times 10^{-5}\phi_o$ equivalent input noise level can be obtained. This means that over one lobe of a SQUID response curve (one $\phi_o$) the SQUID could distinguish about 30,000 different signal levels. The required sensitivity to input signal levels has already been demonstrated. SQUID amplifiers have been fabricated in NbN and input sensitivities of less than 1 pA have been measured.

FIG. 1 illustrates this approach. The detector bias current is split between the detector and a matched reference resistor. The two currents are recombined through the input coil of the SQUID of the aforementioned copending application Ser. No. (W.E. Case No. 55201). Thus, to a first approximation, noise on the detector bias current cancels while changes in detector current cause an imbalance which adds at the SQUID input. Since the detector output is transformer coupled, many detectors can be biased in series from a common current source. The SQUID can be biased so that its output voltage is a function of the flux coupled into the SQUID.

In the customary approach, the SQUID output would be fed to the input of a Josephson A/D converter. In contrast, with the novel circuit of the aforementioned copending application, junction J2 of the SQUID is itself an oscillator which can directly drive the counter. By placing the nonhysteresis-shunt resistance $R_s$ across only J1, the SQUID inductance causes J2 to oscillate with narrow, easily-counted pulses. A relatively high resistance (as opposed to a low resistance nonhysteresis-shunt) damping resistor can be used across J2. Thus the shunt across nonhysteresis-shunted Josephson junction J1 generally has a resistance of about 10 micro-ohms, while the damping resistor connected across the output Josephson junction J2 may have a resistance of about 3.5 ohms. This provides a DC SQUID which is asymmetrical in resistance.

Thus in FIG. 1, for a given level of infrared flux reaching the detector element 10, there is a corresponding current flowing through the detector element 10 and the lower portion of the detector output inductor 12. As the total bias current is constant, the current through the reference resistor 14 will be equal to the total detector bias current minus the detector element current. The detector element current and the current through the reference resistor flow in opposite directions in the reference resistor and the detector output inductor 12 and a flux proportional to the difference between the two currents will be coupled to the SQUID amplifier-oscillator 16 through the transformer secondary. Changes in infrared level cause changes in detector current which in turn cause an opposite current charge through the reference resistor, so that the flux changes add in the primary winding giving gain of a factor of two for the secondary winding to convert into a current signal driving the SQUID input.

Flux coupled from the detector's output inductor 12 into the SQUID's input inductor 18 causes a signal current (proportional to the flux) to flow in the SQUID amplifier loop (as J1 and J2 are dc current biased at about their critical current, the magnitude of the signal current at any point in time offsets the bias current so that, for example, more flows through J1, and less through J2). The offsetting of the bias current changes the frequency at which the SQUID amplifier loop oscillates (and voltage across J2) as a function of the signal current (and thus a function of the flux coupled from the detector's output inductor 12). The oscillation frequency will change by about $\mu 83$ MHz for each $\mu V$ bias change. The shunt 20 eliminates the hysteresis of J1, increasing the SQUID sensitivity, while J2 does not have a low resistance shunt (J2 may, however, be paralleled by a high resistance damping resistor) and thus the voltage across J2 is relatively high and thus can be used to drive the integrating counter 22. The calculation of th maximum shunt resistance which will provide nonhysteretic conditions is well known and is described, for example, in the aforementioned U.S. Pat. No. 4,496,854 to Chi et al, and the shunt across J2 is below this value, and any damping resistor typically above (generally at least three orders of magnitude) this value. The gate timer 24 provides gates so that the integrating counter 22 counts the oscillations for a predetermined period of time. The number of counts at the end of a period is a function of oscillation frequency of the SQUID amplifier which is controlled by the level of the flux the SQUID amplifier loop experiences from the signal during the period of time.

Thus a constant level of infrared on the detector element 10 would give a constant flux, a constant offset, and a constant frequency of oscillation, and, during time periods of the same length, a constant number of counts on the integrating counter 22. A shift in level of infrared would then shift the flux, the flux offset will change the frequency of oscillation, and give a different number of counts in a like time period.

Figure 2A:
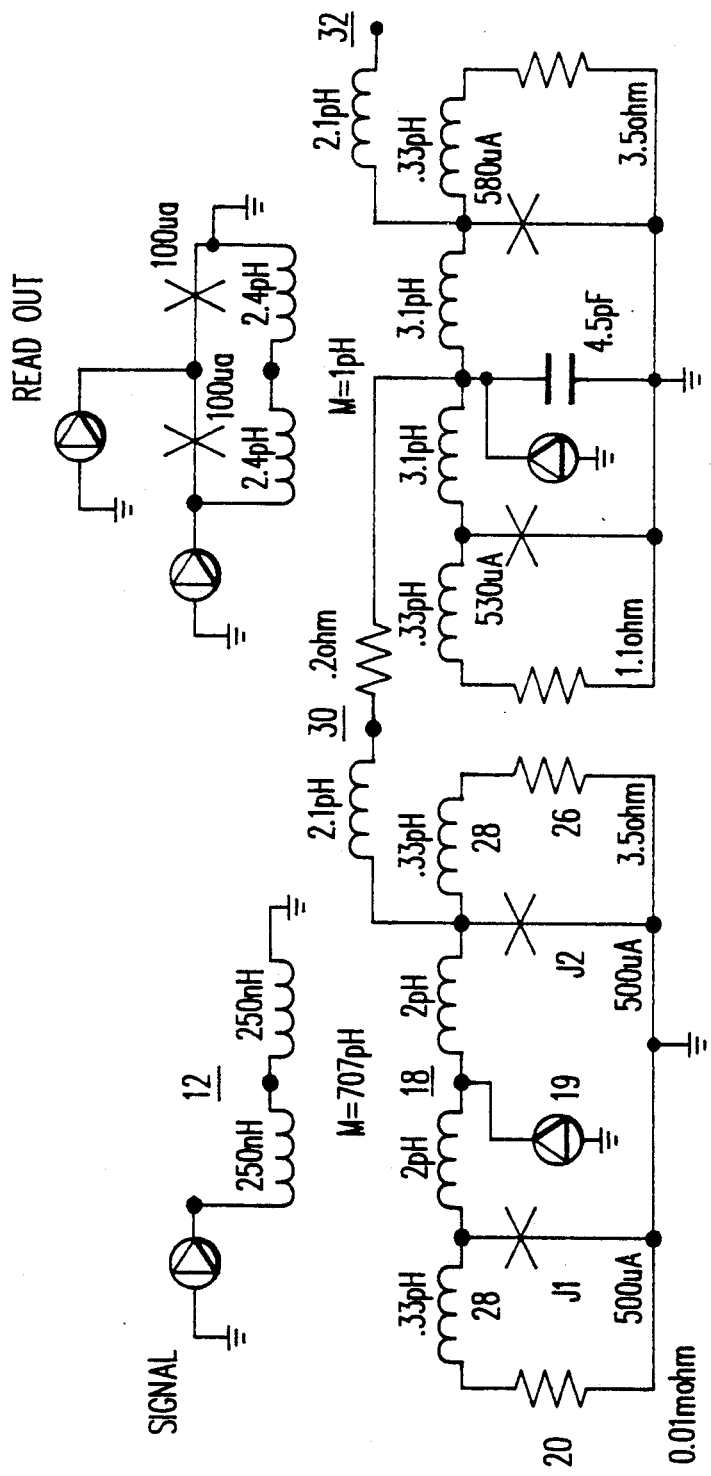
FIG. 2 is a diagram showing an alternate configuration of the A/D converter with the superconducting analog-to-digital converter followed by a two-bit counter.
Figure 2B:
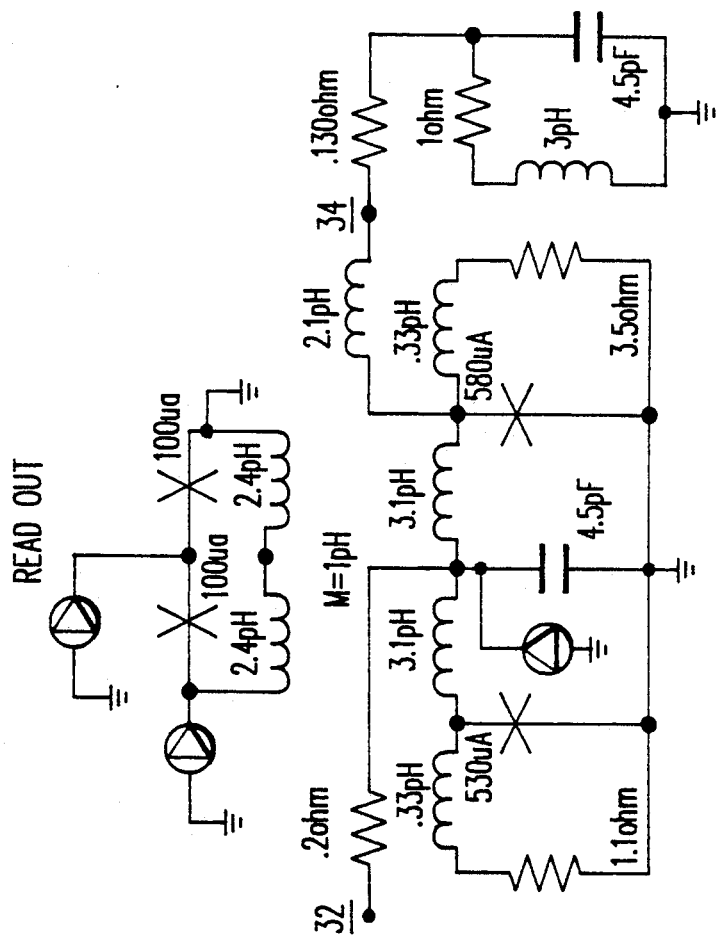

FIG. 2 shows a slightly different SQUID amplifier-oscillator configuration with the SQUID bias current introduced into a center tap of SQUID input inductor 18. FIG. 2 also shows typical values of components (J1 and J2 have critical currents of 500 microamps, in the FIG. 2 configuration).

This novel circuit can be used, for example, to build a superconductive infrared focal plane array. The output signal from the detector circuit can be transformer coupled to a SQUID amplifier. With proper detector bias current, the signal which is transformer coupled into the SQUID amplifier is primarily due to the photo-current only. This detector arrangement can produce a 320 pA current signal in the SQUID amplifier circuit corresponding to a 1.6 pA input detector signal. The SQUID amplifier can have an equivalent sensitivity of 1 pA if we use the $10^{12}$ photon/cm$^2$-sec signal with a (100 $\mu$m)$^2$ detector and a 1 m sec integration time. The resolution of this arrangement should be approximately 300 photons or Background Limited Imaging Performance (BLIP). Such sensitivity is excellent and will provide a digital signal output through the integrating A/D converter.

Thus the high temperature superconductor readout circuit operates in a current mode. This method allows for BLIP performance at $10^{12}$ photons/cm$^2$-sec when used in conjunction with a SQUID amplifier and a superconducting Josephson Function based A/D integrating counter. The power consumption of this detector is very low because of superconducting technology. The projected dynamic range is 12 bits. The description provided is a circuit designed to sense and digitize a 160 pA photoresponse signals to an accuracy of 0.5 pA in an integration measurement time of 1 msec. Furthermore, the power dissipation of the circuit is less than 100 $\mu$W. Incorporation of such a low power A/D counter on the infrared focal plane array is possible; a situation not compatible with semiconductor based A/D based counters.

The invention is not to be construed as limited to the particular examples described herein, as these are to be regarded as illustrative, rather than restrictive. The invention is intended to cover all devices which do not depart from the spirit and scope of the invention.

I claim:

1. An infrared sensor for producing an output which is a function of an infrared light level, said infrared sensor comprising:
   a. a superconducting transformer having a first primary winding, a second primary winding, and a secondary;
   b. a granular high temperature oxide superconductor film connected in series with said first primary winding to provide a first series combination;
   c. a reference resistor connected in series with said second primary winding to provide a second series combination; and
   d. a constant bias current source connected in a manner so that said first series combination and said second series combination are in parallel with respect to said current source and so that currents induced in the secondary from the primary windings as a result of the bias current are in bucking relationship, said current source being controllable to provide a bias current through the high temperature oxide superconductor film which is at least equal to the critical current of the high temperature oxide superconductor film when the infrared light level on the high temperature oxide superconductor film is essentially zero; whereby a increase in infrared light level will cause a drop in current through the high temperature oxide superconductor film and thereby an increase in current through the reference resistor, and as the primary windings are in bucking relationship, the change in current in the secondary is the sum of the absolute values of the changes in current through the high temperature oxide superconductor film and the reference resistor, and thus the current in the secondary of the transformer is a function of the infrared light level on the granular high temperature oxide superconductor film.

2. The sensor of claim 1, wherein said reference resistor and said high temperature oxide superconductor film have resistances which are essentially equal when the infrared light level on said high temperature oxide superconductor film is essentially zero.

3. The sensor of claim 1, wherein said first primary winding and said second primary winding have a common connection.

* * * * *